(12) United States Patent
Ravid et al.

(10) Patent No.: US 9,490,154 B2
(45) Date of Patent: Nov. 8, 2016

(54) METHOD OF ALIGNING SUBSTRATE-SCALE MASK WITH SUBSTRATE

(71) Applicant: Applied Materials, Inc., Santa Clara, CA (US)

(72) Inventors: Abraham Ravid, San Jose, CA (US); Todd Egan, Fremont, CA (US); Paul Connors, San Mateo, CA (US); Sergey Starik, Kyiv (UA); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 14/598,061

(22) Filed: Jan. 15, 2015

(65) Prior Publication Data

US 2016/0211185 A1 Jul. 21, 2016

(51) Int. Cl.
| | |
|---|---|
| *H01L 21/68* | (2006.01) |
| *G03F 7/20* | (2006.01) |
| *H01L 21/66* | (2006.01) |
| *H01L 21/308* | (2006.01) |
| *H01L 21/67* | (2006.01) |
| *G03F 9/00* | (2006.01) |
| *H01L 21/027* | (2006.01) |
| *H01L 23/544* | (2006.01) |

(52) U.S. Cl.
CPC .............. *H01L 21/682* (2013.01); *G03F 7/70* (2013.01); *G03F 9/70* (2013.01); *G03F 9/7023* (2013.01); *G03F 9/7034* (2013.01); *G03F 9/7042* (2013.01); *H01L 21/027* (2013.01); *H01L 21/308* (2013.01); *H01L 21/67063* (2013.01); *H01L 22/20* (2013.01); *H01L 23/544* (2013.01)

(58) Field of Classification Search
None
See application file for complete search history.

(56) References Cited

U.S. PATENT DOCUMENTS

| | | | |
|---|---|---|---|
| 3,887,421 A | 6/1975 | Hudson et al. | |
| 3,955,163 A | 5/1976 | Novak | |
| 4,037,969 A | 7/1977 | Feldman et al. | |
| 4,315,692 A | 2/1982 | Heinecke et al. | |
| 5,703,493 A | 12/1997 | Weeks et al. | |
| 5,869,386 A * | 2/1999 | Hamajima | G03F 9/70 148/DIG. 102 |
| 6,118,517 A | 9/2000 | Sasaki et al. | |
| 6,150,231 A | 11/2000 | Muller et al. | |
| 6,568,098 B1 | 5/2003 | Beckhart et al. | |
| 2004/0207097 A1 | 10/2004 | Carpi et al. | |
| 2007/0077503 A1 | 4/2007 | Yoo | |
| 2009/0102070 A1* | 4/2009 | Feger | H01L 21/563 257/797 |
| 2012/0038899 A1* | 2/2012 | Ahn | G01B 11/00 355/72 |
| 2014/0162385 A1* | 6/2014 | Huh | H01L 21/68735 438/26 |
| 2014/0170783 A1* | 6/2014 | Webb | H01L 21/266 438/14 |

(Continued)

*Primary Examiner* — Michael Jung
(74) *Attorney, Agent, or Firm* — Kilpatrick Townsend & Stockton LLP

(57) ABSTRACT

Methods and systems for alignment of substrate-scale masks are described. The alignment methods presented may improve the uniformity and repeatability of processes which are impacted by the relative lateral position of a substrate-scale mask and a substrate. The methods involve measuring the "overhang" of the substrate at multiple locations around the periphery of the substrate-scale mask. Based on the measurements, the relative position of the substrate relative to the substrate-scale mask is modified by adjustment of the substrate and/or mask position. The adjustment of the relative position is made in one adjustment in embodiments. A feature of hardware and methods involves the capability of making measurements and adjustments while a substrate processing system is fully assembled and possibly under vacuum.

8 Claims, 6 Drawing Sheets

(56) References Cited

U.S. PATENT DOCUMENTS

2014/0253897 A1* 9/2014 Liu ................ H01L 21/682 355/71

2015/0185625 A1* 7/2015 Chen ................ G03F 7/70633 702/182

2015/0311118 A1* 10/2015 Lei ................ H01L 21/78 438/463

* cited by examiner

METHOD OF ALIGNING SUBSTRATE-SCALE MASK WITH SUBSTRATE

FIELD

The present invention relates to methods and equipment for aligning substrate-scale masks over substrates.

BACKGROUND

Integrated circuits are made possible by processes which produce intricately patterned material layers on substrate surfaces. Layers are deposited and patterned on a substrate many, many times during production of a substrate of integrated circuits. Generally speaking, each layer deposits not only on the front of the substrate but also along the edge of the substrate. Leftover material around the edge can negatively impact downstream processes by complicating substrate handling and forming debris which may relocate to the front or back of the substrate. Debris on the front of the substrate directly impacts yield while debris on the back negatively impacts, e.g., the focus integrity during photolithography.

Substrate-scale masks cover the front of a substrate and allow any deposition on the edge of a substrate to be removed by etch processes. The substrate-scale mask is affixed to the interior of the processing chamber and moved towards the front of the substrate prior to the edge etch. Positioning of the substrate-scale mask determines the uniformity of the edge etch process along the perimeter of the substrate.

Therefore, a system and method is needed for aligning a substrate-scale mask to process the edge of a substrate.

BRIEF SUMMARY

Methods and systems for alignment of substrate-scale masks are described. The alignment methods presented may improve the uniformity and repeatability of processes which are impacted by the relative lateral position of a substrate-scale mask and a substrate. The methods involve measuring the "overhang" of the substrate at multiple locations around the periphery of the substrate-scale mask. Based on the measurements, the relative position of the substrate relative to the substrate-scale mask is modified by adjustment of the substrate and/or mask position. The adjustment of the relative position is made in one adjustment in embodiments. Both the substrate and the substrate-scale mask may be circular and the substrate-scale mask may only allow precursor access between the substrate-scale mask and the substrate through the edges. A feature of hardware and methods involves the capability of making measurements and adjustments while a substrate processing system is fully assembled and possibly under vacuum.

Embodiments of the invention include methods of etching a substrate. The methods include placing the substrate in a substrate processing region of a substrate processing chamber. The methods further include evacuating the substrate processing region to a pressure of less than 80 Torr. The methods further include moving a substrate-scale mask towards the substrate. The substrate-scale mask and the substrate are parallel. The substrate-scale mask is smaller than the substrate in two or more lateral directions. The methods further include making a first measurement of a first overhang of the substrate beyond an edge of the substrate-scale mask at a first location around a perimeter of the substrate-scale mask. The methods further include making a second measurement of a second overhang of the substrate beyond an edge of the substrate-scale mask at a second location around the perimeter. The methods further include moving the substrate laterally such that the substrate-scale mask and the substrate are laterally aligned. An amount of motion is calculated from the first measurement of the first overhang and the second measurement of the second overhang.

The methods may further include making a third measurement of a third overhang of the substrate beyond the edge of the substrate-scale mask at a third location around the perimeter and using the third measurement, the second measurement and the first measurement to determine the amount of motion. The distance from the substrate-scale mask to the substrate may be less than 50 µm. Each of the substrate and the substrate-scale mask may be circular and a diameter of the substrate-scale mask is smaller than a diameter of the substrate. Each of the substrate and the substrate-scale mask may be rectangular and a major dimension of the substrate-scale mask may be less than a major dimension of the substrate and a minor dimension of the substrate-scale mask may be less than a minor dimension of the substrate. Each of the first overhang and the second overhang may be less than 3 mm following the operation of moving the substrate laterally.

Embodiments of the invention include substrate processing chambers. The substrate processing chambers include a substrate processing region configured to maintain a substrate processing pressure of less than 80 Torr while a pressure outside the substrate processing chamber is greater than 700 Torr. The substrate processing chambers further include a substrate pedestal configured to support a substrate. The substrate processing chambers further include a substrate-scale mask configured for perpendicular adjustment relative to the major plane of the substrate. The substrate-scale mask is adjustable between a distant position away from the substrate (e.g. >1000 µm) and a near position within 100 µm of the substrate. The substrate-scale mask and the substrate are parallel to one another when the substrate-scale mask is in the distant position and the near position. The substrate processing chambers further include a plurality of optical sensors configured to make a plurality of optical measurements at a plurality of measurement positions on a perimeter of the substrate-scale mask. The plurality of optical measurements are indicative of a plurality of spatial measurements of distance the substrate extends beyond the substrate-scale mask (also known as "the overhang"). The substrate processing chambers further include a translation mechanism for adjusting the substrate-scale mask laterally relative to the substrate, each adjusted within their major plane. The translation mechanism adjusts either the substrate-scale mask or the substrate or both of them to achieve the translation. The substrate processing chambers further include a pumping system for evacuating the substrate processing region.

The plurality of optical sensors may be disposed outside the substrate processing region and optically access the substrate-scale mask and the substrate through one or more viewports. The plurality of optical sensors may include at least two optical sensors separated by ninety degrees relative to a geometric center of the substrate-scale mask. The plurality of optical sensors may include at least three optical sensors. Two of the at least three optical sensors may be angularly centered opposite one of the at least three optical sensors. The plurality of optical sensors may include at least three optical sensors spaced at one hundred and twenty degrees relative to a geometric center of the substrate-scale mask. Each of the plurality of optical sensors may be a linear optical sensor configured to perform a line scan radially outward from a geometric center of the substrate-scale mask. Each of the plurality of optical sensors may be a camera configured to take a two dimensional image including a portion of the substrate-scale mask and a portion of the substrate. Each of the substrate-scale mask and the substrate may be circular. Each of the substrate-scale mask and the substrate may be rectangular.

Embodiments of the invention include methods of etching a substrate. The methods include placing the substrate in a substrate processing region of a substrate processing chamber. The methods further include evacuating the substrate processing region to a pressure of less than 80 Torr. The methods further include moving a substrate-scale mask towards the substrate. The substrate-scale mask and the substrate are parallel and a spacing between the substrate-scale mask and the substrate is less than 100 µm after the motion. The substrate-scale mask and the substrate are both circular and the substrate-scale mask has a diameter which is less than a diameter of the substrate. The methods further include making a first measurement of a first overhang of the substrate beyond an edge of the substrate-scale mask at a first location around a circumference of the substrate-scale mask. The methods further include making a second measurement of a second overhang of the substrate beyond an edge of the substrate-scale mask at a second location around the circumference. The methods further include moving the substrate laterally such that the substrate-scale mask and the substrate are essentially concentric. An amount of motion is calculated from the first measurement of the first overhang and the second measurement of the second overhang. The methods further include preferentially etching a film from a circumference of the substrate by flowing an etching precursor to the circumference of the substrate. The first location and the second location may be ninety degrees from one another around the circumference of the substrate-scale mask as measured from the geometric center of the substrate-scale mask.

Additional embodiments and features are set forth in part in the description that follows, and in part will become apparent to those skilled in the art upon examination of the specification or may be learned by the practice of the embodiments. The features and advantages of the embodiments may be realized and attained by means of the instrumentalities, combinations, and methods described in the specification.

BRIEF DESCRIPTION OF THE DRAWINGS

A further understanding of the nature and advantages of the embodiments may be realized by reference to the remaining portions of the specification and the drawings.

Figure 1:
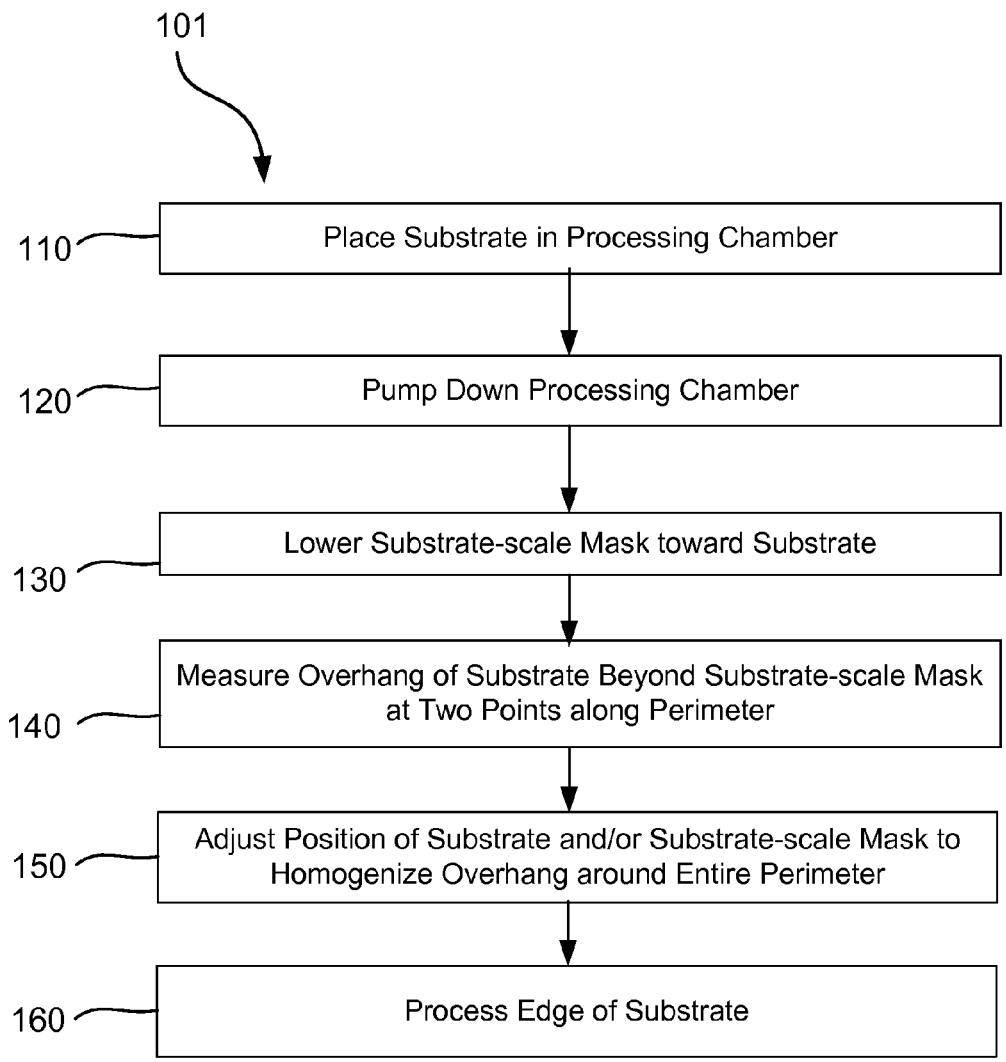
FIG. 1 is a flow chart of a substrate-scale alignment process according to embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods and systems for alignment of substrate-scale masks are described. The alignment methods presented may improve the uniformity and repeatability of processes which are impacted by the relative lateral position of a substrate-scale mask and a substrate. The methods involve measuring the "overhang" of the substrate at multiple locations around the periphery of the substrate-scale mask. Based on the measurements, the relative position of the substrate relative to the substrate-scale mask is modified by adjustment of the substrate and/or mask position. The adjustment of the relative position is made in one adjustment in embodiments. Both the substrate and the substrate-scale mask may be circular and the substrate-scale mask may only allow precursor access between the substrate-scale mask and the substrate through the edges. A feature of hardware and methods involves the capability of making measurements and adjustments while a substrate processing system is fully assembled and possibly under vacuum. Benefits of the present invention include greater uniformity than previously possible for substrate edge processes which translates to higher yields for integrated circuits located near the edge of the substrate. Benefits further include a reduction in edge exclusion which may allow a greater number of integrated circuits per substrate.

Substrate-scale masks are masks which cover essentially an entire substrate while exposing only the edges or perimeter of the substrate. Substrate-scale masks may be the same shape as substrates. A substrate-scale mask and the to-be-masked substrate may each be rectangular according to embodiments. A substrate-scale mask and the to-be-masked substrate may each be circular, in embodiments, and the substrate may be referred to as a wafer whereas the substrate-scale mask may be referred to as a wafer-scale mask. Substrate-scale masks may be used during processes which are intended to affect only the edge of the substrate and exemplary edge processes may involve etching or deposition in embodiments. The substrate may be slightly larger than the substrate scale mask in two or more directions (perhaps perpendicular from one another) and the extent to which the substrate extends beyond an edge of the substrate-scale mask will be referred to as "overhang". The overhang may vary about the perimeter of the substrate-scale mask which may cause undesirable process variation around the substrate. The alignment procedures and equipment described herein address and correct this variation such that overhang is more similar around the substrate. Following alignment, the overhang may be less than 3 mm, less than 2 mm or less than 1 mm at each point around the substrate according to embodiments. Past methods for performing the alignment addressed herein have involved performing a process (such as an etch) with the misalignment and then measuring the edge nonuniformity to determine an adjustment and adjust the pedestal position accordingly. A benefit of the present invention is a reduction in non-value-added processing, a reduction in the use of dummy wafers and reduction of scrapped wafers.

The overhang is measured in the methods described herein using a plurality of optical sensors. Each of the plurality of optical sensors may be a linear optical sensor which acquires a line scan of optical intensity. The line scan of optical intensity may be analyzed to determine the overhang and the concentricity or centrality of the substrate with respect to the substrate-scale mask. The orientation of the line scans may each be radial relative to the geometric center of the substrate-scale mask to simplify analysis. Linear optical sensors lend themselves directly to the data described below in FIGS. 3A-3D. Each of the plurality of optical sensors may alternatively be a camera configured to take a two dimensional image including a portion of the substrate-scale mask and a portion of the substrate. The two-dimensional image may then be processed to form a line scan having radial orientation and analysis may proceed as if a linear optical sensor were used. The optical sensors may be located above the substrate and "face" downward to image the substrate-scale mask and substrate. "Top", "above" and "up" will be used herein to describe portions/directions perpendicularly distal from the substrate plane and further away from the center of mass of the substrate in the perpendicular direction. "Vertical" will be used to describe items aligned in the "up" direction towards the "top". Other similar terms may be used whose meanings will now be clear.

Figure 2A:
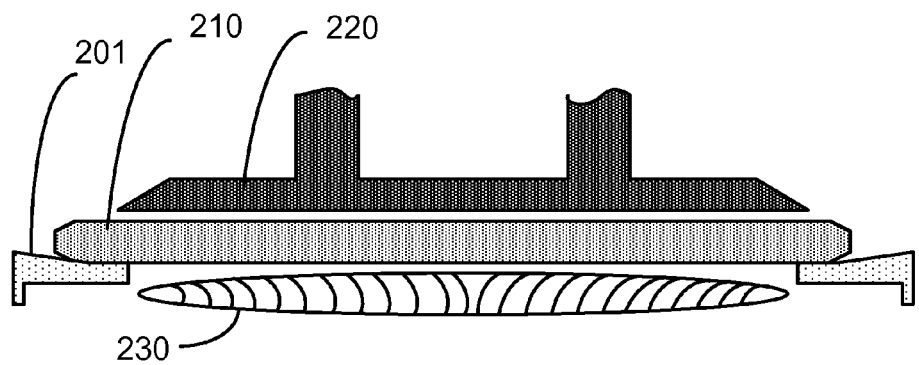
FIG. 2A is a side view of a substrate processing system having substrate-scale mask alignment capabilities according to embodiments.
Figure 2B:
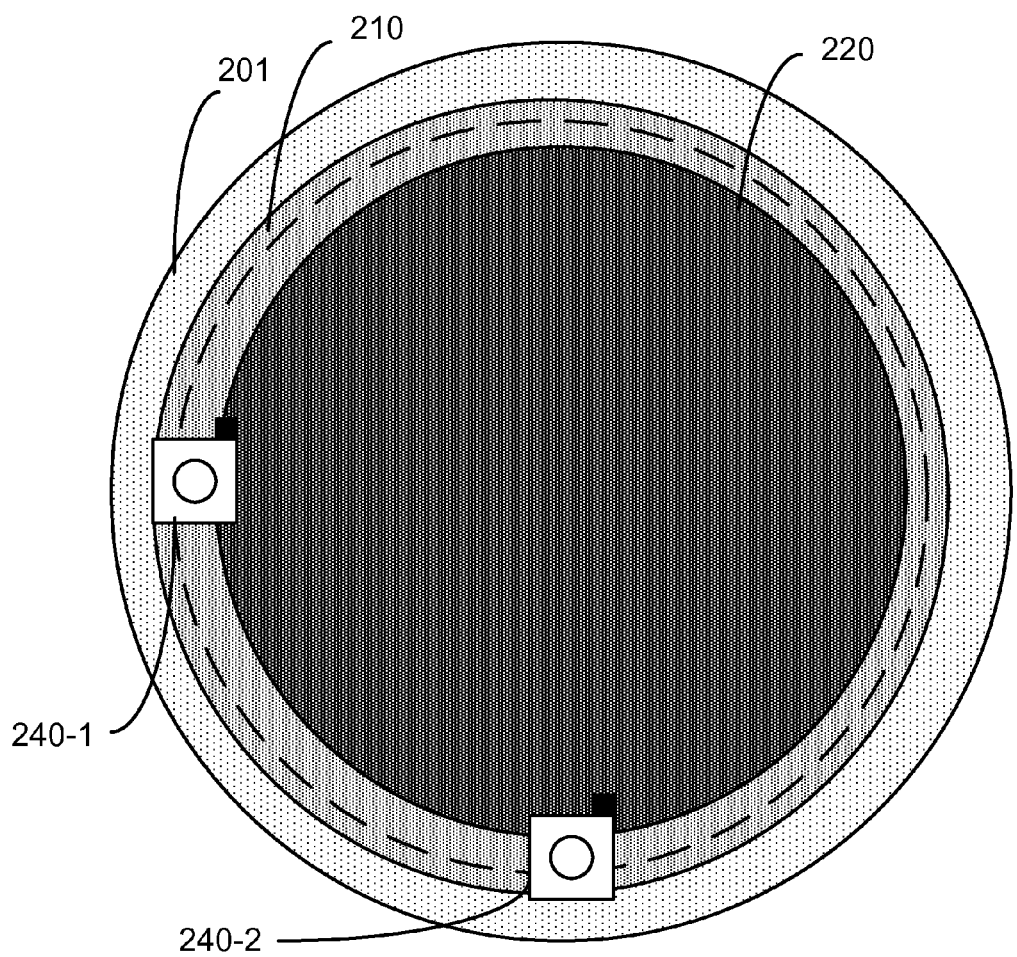
FIG. 2B is a top view of a substrate processing system having substrate-scale mask alignment capabilities according to embodiments.

In order to better understand and appreciate embodiments of the invention, reference is now made to FIG. 1 which is a flow chart of a substrate-scale alignment process process 101. Side and top views of a substrate processing system having substrate-scale mask alignment capabilities are depicted in FIGS. 2A, 2B. 4A and 4B. Reference will concurrently be made to optical intensity profiles at different locations around the perimeter of the substrate before and after substrate-scale alignment process 101 as shown in FIGS. 3A, 3B, 3C and 3D.

Substrate 210 is placed in a substrate processing region of a substrate processing chamber in operation 110. Substrate 210 rests upon pedestal 201 within the substrate processing region and rests just above a heater 230 which may be separate from or within pedestal 201. A substrate-scale mask 220 may be affixed to the interior of the substrate processing region and may be affixed to the interior of the substrate processing chamber according to embodiments. A means for adjusting the position of substrate-scale mask 220 up and down in FIG. 2A is provided by the affixture. The orientation of the substrate 210 and other objects of the figures is the most likely configuration but other orientations are also possible. Therefore, "up" may mean in the opposite direction of gravitational attraction but may mean any direction according to embodiments in which case all other objects are rotated to maintain their relative positions and orientations indicated herein.

Substrate processing region of substrate processing chamber is evacuated to a low pressure (e.g. less than 80 Torr) relative to the outside atmosphere (operation 120) using a pumping system located outside the substrate processing chamber. Substrate-scale mask 220 is lowered/moved toward substrate 210 in operation 130. Substrate-scale mask 220 is positioned close to substrate 210 following the motion toward substrate 210. Both substrate-scale mask 220 and substrate 210 may have major planes which are parallel to one another before or after operation 130 according to embodiments.

"Substrate-scale mask" is used to describe a mask which is approximately the same dimension as the substrate itself in their major planes (the planes which intersect the most material). "Substrate-scale" is meant to differentiate the substrate-scale mask from other masks which may operate in different optical planes having distinct length scales. Substrate-scale masks may serve to avoid allowing gases and precursors from passing through the substrate-scale mask and instead force gases and precursors to travel around the wafer-scale mask. Such a lack of "porosity" may ensure precursors react predominantly with the edge of substrate 210.

A relatively constant gap may exist between substrate-scale mask 220 and substrate 210. On the other hand, substrate 210 may have a flat face and substrate-scale mask 220 may be concave or bowed upward toward the center in FIG. 2A. Concavity may hedge against inadvertent contact across the substrate surface and still serves the purpose of promoting a preferential reaction between precursors and the edge of substrate 210. The major plane of a concave substrate-scale mask 220 is defined herein as the plane which passes through the "ring" of substrate-scale mask 220 closest to substrate 210 and positioned out near the edge. Following operation 130, the major planes of substrate-scale mask 220 and substrate 210 may be separated by less than 50 µm or less than 100 µm according to embodiments.

Optical sensors 240-1 and 240-2 are placed at various points along the periphery of substrate-scale mask 220. Optical sensors 240-1 and 240-2 may emit and detect light reflected off both substrate 210 and substrate-scale mask 220. The optical sensors 240-1 and 240-2 may be linear optical sensors which acquire a line of data instead of a two-dimensional array of data. The line of data may represent data aligned with a radius of substrate 210 and/or substrate-scale mask 220 according to embodiments. The data acquired with optical sensor 240-1 is represented in FIG. 3A and the line of data acquired with optical sensor 240-2 is represented in FIG. 3B.

Figure 3A:
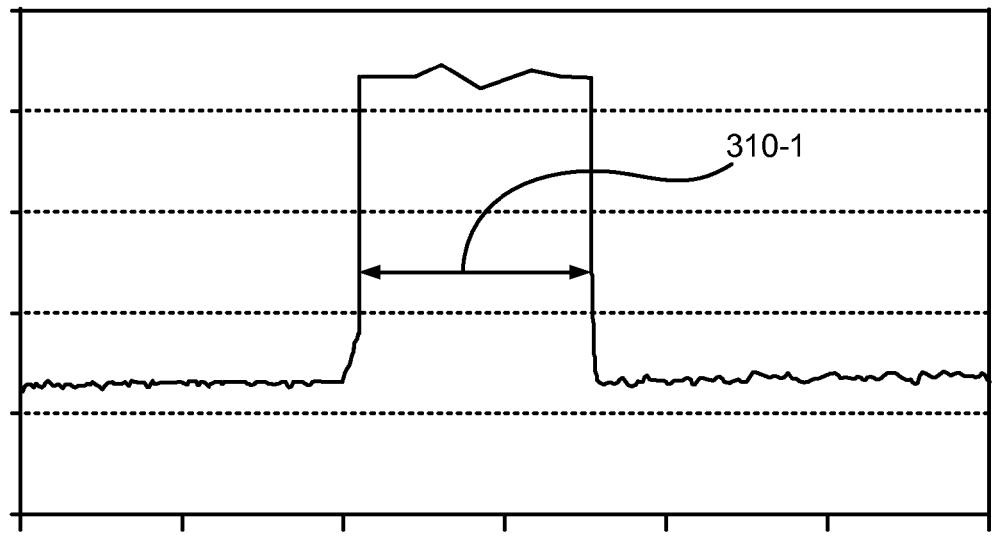
FIG. 3A and 3B are optical intensity profiles at different locations around the perimeter of the substrate before a substrate-scale alignment process according to embodiments.
Figure 3B:
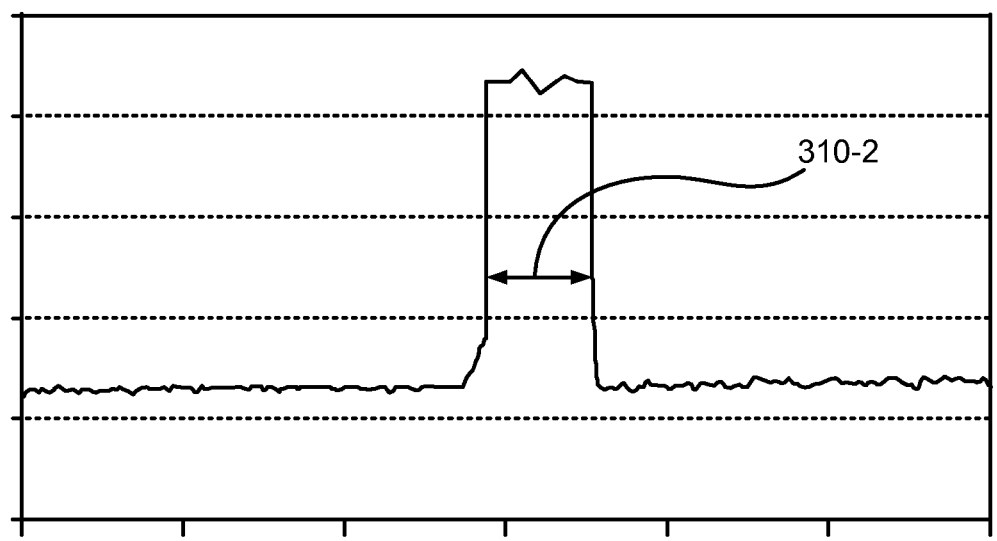

The flat middle portion of each of FIGS. 3A and 3B represents the flat overhang portion of substrate 210 which can be seen in FIG. 2B between the dotted line and the edge of substrate-scale mask 220. The flat overhang portion under optical sensor 240-1 is wider than the flat overhang portion under optical sensor 240-2 and the difference is clear in FIGS. 3A and 3B. Optical sensors 240 register a larger intensity for flat reflective surfaces and the regions to the left and right of the large intensity portions of FIGS. 3A and 3B represent sloped portions of substrate 210 and substrate-scale mask 220. The slopes deflect light away from the detector creating the lower values. This simple optical phenomenon is only one possible mechanism. Substrate-scale alignment process 101 requires only that the various regions register different intensities. The middle portion may have a higher or lower intensity than the left and/or right portions of FIGS. 3A and 3B depending on the optical mechanism. The optical mechanism creating the differences may include one or more of slope angle, reflectivity, coarseness, absorption.

Regardless of optical mechanism, lines of intensity in FIGS. 3A and 3B can be analyzed to determine the overhang portions (310-1 and 310-2, respectively) in operation 140. The high intensity peak of FIG. 3A is thinner than FIG. 3B which indicates that a correction to the relative position of substrate 220 relative to substrate-scale mask 230 is desirable. The amount of correction may be calculated from any two measurements as long as the locations of optical sensor 240-1 and 240-2 are not placed diametrically opposite one another. In practice, the calculations are very simple if the optical sensors 240-1 and 240-2 are placed at a separation of ninety degrees around the circumference of circular substrate 210 and circular substrate-scale mask 220. A separation of ninety degrees also helps for other shapes of substrate 210 and substrate-scale mask 220.

Figure 3C:
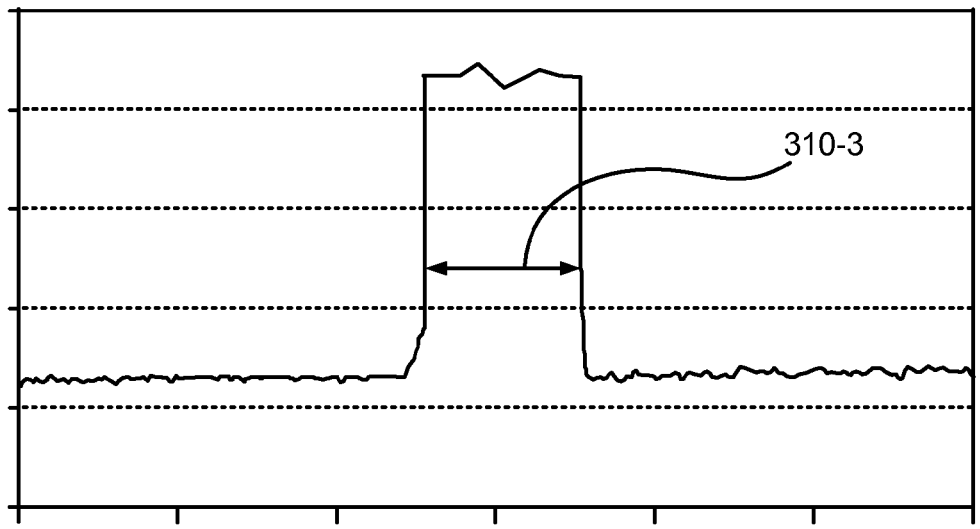
FIG. 3C and 3D are optical intensity profiles at different locations around the perimeter of the substrate after a substrate-scale alignment process according to embodiments.
Figure 3D:
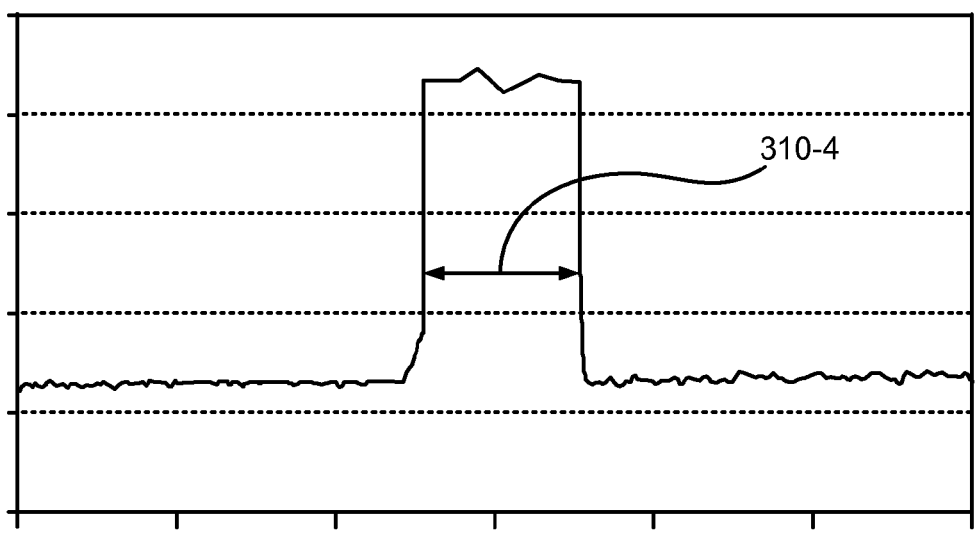
Figure 4A:
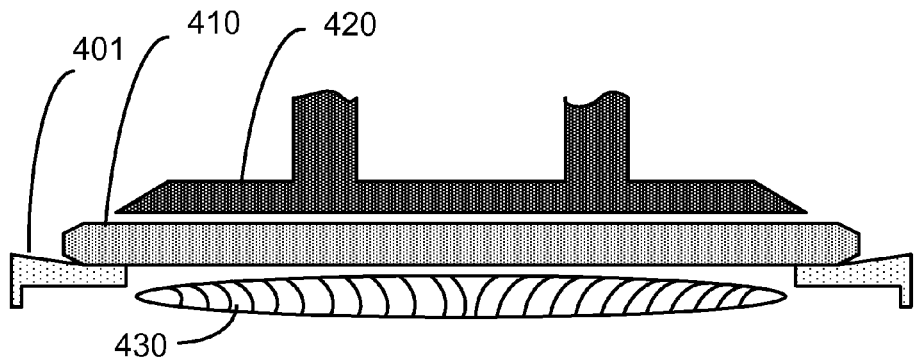
FIG. 4A is a side view of a substrate processing system having substrate-scale mask alignment capabilities according to embodiments.
Figure 4B:
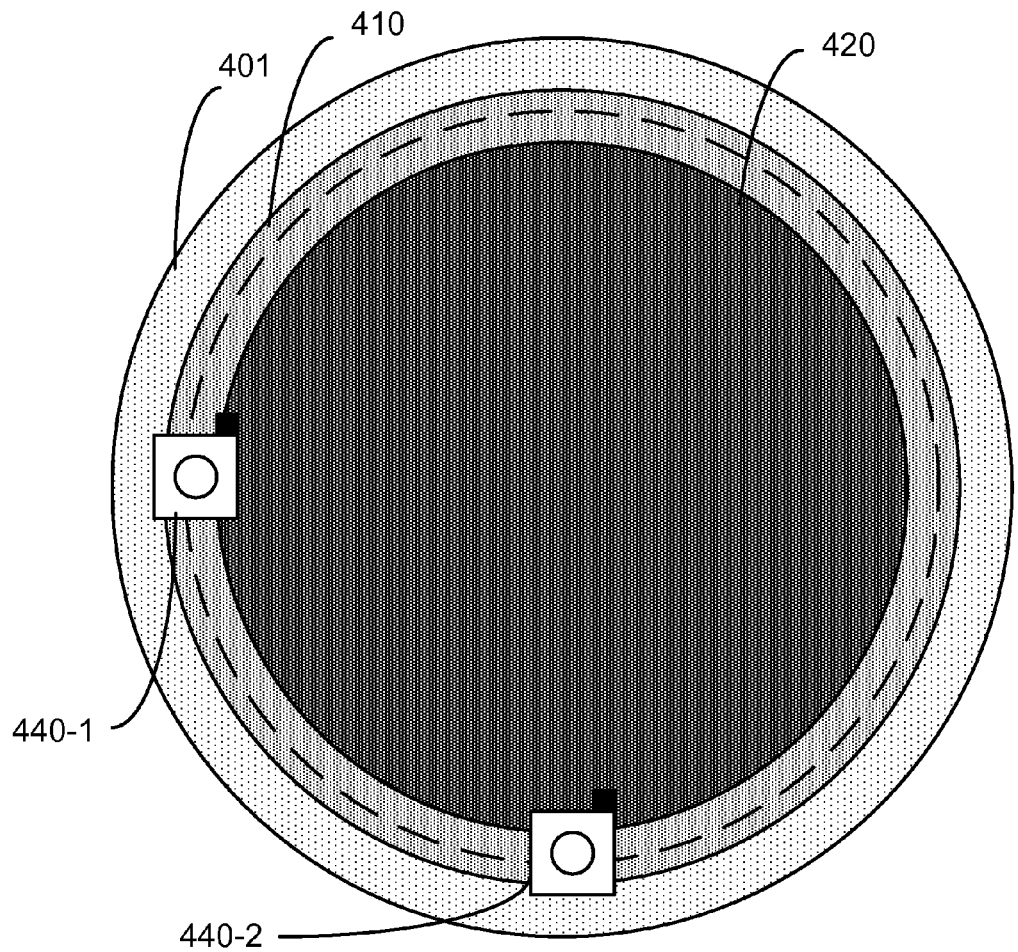
FIG. 4B is a top view of a substrate processing system having substrate-scale mask alignment capabilities according to embodiments.

The position of substrate 210 is adjusted to make the overhang very nearly the same around the perimeter of substrate-scale mask 220 (operation 150). Only one adjustment is necessary as a result of using two optical sensors 240 and avoiding degenerate angular separations. The overhang as measured around the perimeter of substrate-scale mask 220 may vary by less than 1 mm, less than 0.5 mm or less than 0.25 mm, according to embodiments, after operation 150. FIGS. 3C and 3D indicate overhangs 310-3 and 310-4 which are closer together indicating improved alignment between substrate 210 and substrate-scale mask 220. FIGS. 3C and 3D represent repeated measurements of FIGS. 3A and 3B, respectively, but after operation 150. Analogously, FIGS. 4A and 4B show side and top views of the substrate processing system after alignment (operation 150) is complete. Pedestal 401, substrate 410, substrate-scale mask 420, heater 430 and optical sensors 440 are shown. Following operation 150, the edge of substrate 210 is processed, for example, by flowing etchants into the substrate processing region to remove material uniformly from the edge of substrate 210. An exemplary edge process may be the removal of anti-reflective coating undesirably deposited on the edge prior to optical lithography.

Optical sensors 240 may be cameras which acquire two-dimensional images in embodiments. The term "camera" will be used herein regardless of whether optical sensors 240 initially collect one-dimension or two-dimensional images. Optical sensors 240 may be used to collect two-dimensional images which may then be processed to form optical intensity plots along a radial direction as shown in FIGS. 3A and 3B. Optical sensors 240 may operate at a variety of wavelengths or wavelength ranges. The wavelengths may be selected for high transmittance through viewports on the substrate processing chamber if the optical sensors 240 are located outside the substrate processing region. In embodiments, the optical sensors 240 are mounted inside the substrate processing region and electrical feedthroughs are used to convey the data outside the substrate processing chamber. Optical sensors may operation in the visible (400 nm to 700 nm), the infrared or the ultraviolet according to embodiments.

Figure 5A:
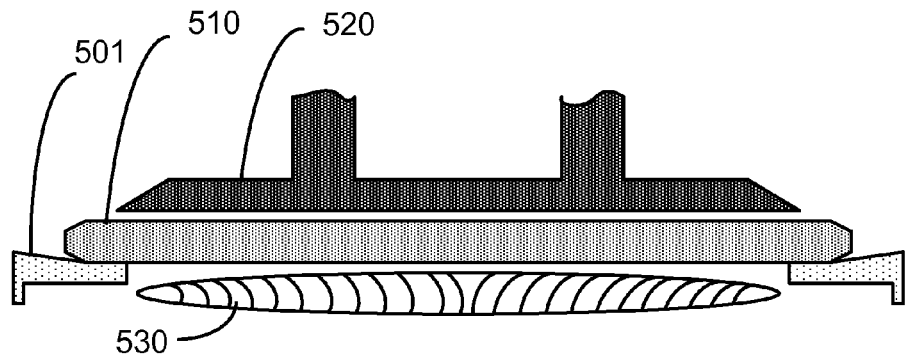
FIG. 5A is a side view of a substrate processing system having substrate-scale mask alignment capabilities according to embodiments.
Figure 5B:
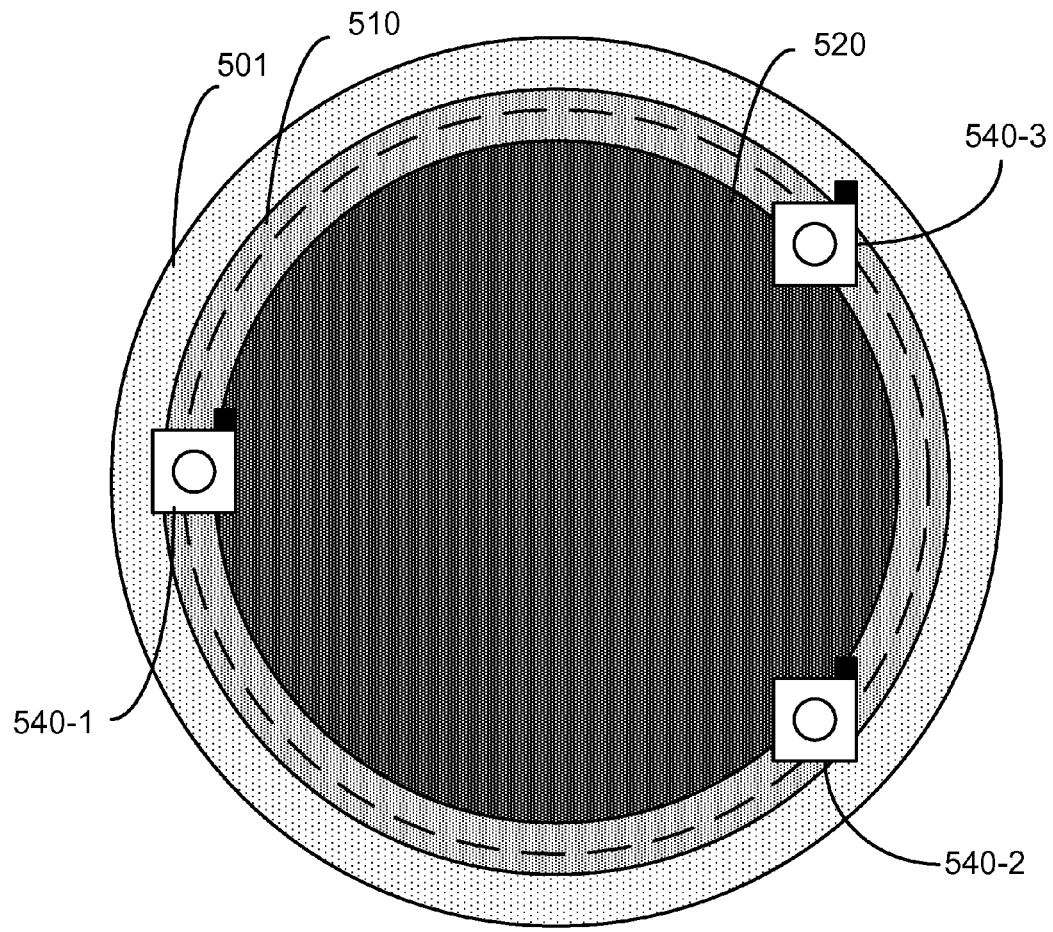
FIG. 5B is a top view of a substrate processing system having substrate-scale mask alignment capabilities according to embodiments.

Two optical sensors were used to measure the overhang (operation 140) in the above example. Three or more optical sensors may be used as shown in FIGS. 5A and 5B. Pedestal 501, substrate 510 (already aligned as shown), substrate-scale mask 520, heater 530 and optical sensors 540 are shown. More than two measurements may be helpful if optical sensors 540 are to be placed outside the substrate processing region but viewports are not available at ninety degree angular separation. Other motivations may exist. Two of the three optical sensors may be separated symmetrically at one end of a diameter through a circular substrate 210 and may be opposite the remaining one of the three optical sensors. The separation between optical sensor 540-2 and 540-3 may be twenty degrees, forty degrees or sixty degrees in embodiments. The separation between optical sensor 540-2 and 540-3 may be 120 degrees, in which case the angular separation between all optical sensors 540 would be uniform. The separation between optical sensors 540-2 & 540-3 may be 90 degrees, in which case the angular separation between 540-1 & 540-2 and between 540-3 & 540-1 may be 135 degrees apiece according to embodiments. Three or more optical sensors may be helpful if the dimensions of a substrate may fluctuate slightly from one substrate to the next. Substrate-scale mask 220, 420 or 520 is reused from one substrate to the next so its dimensions are measureable and known. Each additional measurement may allow an additional degree of freedom to be determined while still solving for the amount of correction needed in operation 150.

Measurement (operation 140) and adjustment (operation 150) may each occur under vacuum in embodiments. The pressure in the substrate processing region may be less than 80 Torr, less than 40 Torr or less than 20 Torr during operations 130, 140 and 150. Changes in pressure may change the relative position of substrate (210, 410 or 510) relative to substrate-scale mask (220, 420 or 520). Performing measurement and adjustment and even edge processing at similar pressures may increase the uniformity of the edge process around the perimeter of substrate 220, 420 or 520. The pressure in the substrate processing region may be the same during two or more of operations 130, 140, 150 and 160.

In the examples presented herein, the measurement may be used to align the substrate prior to undergoing edge processing in operation 160. A benefit of this measurement is that substrate-scale mask alignment process 101 may be included in a production recipe and, therefore, compensate for drift in position in real time before yield is impacted. In contrast, a calibration procedure would be repeated every large number of substrates forcing some relative position drift to be tolerated.

The term "precursor" is used to refer to any process gas which takes part in a reaction to either remove material from or deposit material onto a surface. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a substrate, the method comprising:
   placing the substrate in a substrate processing region of a substrate processing chamber;
   evacuating the substrate processing region to a pressure of less than 80 Torr;
   moving a substrate-scale mask towards the substrate; wherein the substrate-scale mask and the substrate are parallel, and wherein the substrate-scale mask is smaller than the substrate in two or more lateral dimensions;
   making a first measurement of a first overhang of the substrate beyond an edge of the substrate-scale mask at a first location around a perimeter of the substrate-scale mask;
   making a second measurement of a second overhang of the substrate beyond an edge of the substrate-scale mask at a second location around the perimeter; and
   moving the substrate laterally such that the substrate-scale mask and the substrate are laterally aligned, wherein an amount of motion is calculated from the first measurement of the first overhang and the second measurement of the second overhang,
   wherein the substrate-scale mask is approximately the same dimension as the substrate.

2. The method of claim 1 further comprising making a third measurement of a third overhang of the substrate beyond the edge of the substrate-scale mask at a third location around the perimeter and using the third measurement, the second measurement and the first measurement to determine the amount of motion.

3. The method of claim 1 wherein a distance from the substrate-scale mask to the substrate is less than 50 μm.

4. The method of claim 1 wherein each of the substrate and the substrate-scale mask are circular and a diameter of the substrate-scale mask is smaller than a diameter of the substrate.

5. The method of claim 1 wherein each of the substrate and the substrate-scale mask are rectangular and a major dimension of the substrate-scale mask is less than a major dimension of the substrate and a minor dimension of the substrate-scale mask is less than a minor dimension of the substrate.

6. The method of claim 1 wherein each of the first overhang and the second overhang are less than 3 mm following the operation of moving the substrate laterally.

7. A method of etching a substrate, the method comprising:
   placing the substrate in a substrate processing region of a substrate processing chamber;
   evacuating the substrate processing region to a pressure of less than 80 Torr;
   moving a substrate-scale mask towards the substrate; wherein the substrate-scale mask and the substrate are parallel and a spacing between the substrate-scale mask and the substrate is less than 100 μm, and wherein the substrate-scale mask and the substrate are both circular and the substrate-scale mask has a diameter which is less than a diameter of the substrate;
   making a first measurement of a first overhang of the substrate beyond an edge of the substrate-scale mask at a first location around a circumference of the substrate-scale mask;
   making a second measurement of a second overhang of the substrate beyond an edge of the substrate-scale mask at a second location around the circumference;
   moving the substrate laterally such that the substrate-scale mask and the substrate are essentially concentric, wherein an amount of motion is calculated from the first measurement of the first overhang and the second measurement of the second overhang; and
   preferentially etching a film from a circumference of the substrate by flowing an etching precursor to the circumference of the substrate.

8. The method of claim 7 wherein the first location and the second location are separated by ninety degrees around the circumference of the substrate-scale mask.

* * * * *